US011183649B2

(12) United States Patent
Furno et al.

(10) Patent No.: US 11,183,649 B2
(45) Date of Patent: Nov. 23, 2021

(54) ORGANIC ELECTROLUMINESCENT DEVICE

(71) Applicant: NOVALED GMBH, Dresden (DE)

(72) Inventors: Mauro Furno, Dresden (DE); Volodymyr Senkovskyy, Dresden (DE)

(73) Assignee: Novaled GmbH, Dresden (DE)

( * ) Notice: Subject to any disclaimer, the term of this patent is extended or adjusted under 35 U.S.C. 154(b) by 356 days.

(21) Appl. No.: 15/983,197

(22) Filed: May 18, 2018

(65) Prior Publication Data

US 2018/0337352 A1 Nov. 22, 2018

(30) Foreign Application Priority Data

May 22, 2017 (DE) .......................... 102017111137.9

(51) Int. Cl.
  *H01L 51/00* (2006.01)
  *H01L 51/50* (2006.01)
  *H01L 51/52* (2006.01)
(52) U.S. Cl.
  CPC ........ *H01L 51/0094* (2013.01); *H01L 51/005* (2013.01); *H01L 51/006* (2013.01);
  (Continued)
(58) Field of Classification Search
  CPC ............... H01L 51/0094; H01L 51/005; H01L 51/0054; H01L 51/006; H01L 51/0061;
  (Continued)

(56) References Cited

U.S. PATENT DOCUMENTS 8,920,944 B2  12/2014  Limmert et al.
8,963,143 B2   2/2015  Loebl et al.
(Continued)

FOREIGN PATENT DOCUMENTS

EP    3312898 A1    4/2018

OTHER PUBLICATIONS

German Search Report for DE Application No. 102017111137.9 dated Mar. 7, 2018 (6 pages).
(Continued)

*Primary Examiner* — Jayne L Mershon
(74) *Attorney, Agent, or Firm* — Eversheds-Sutherland (US) LLP

(57) ABSTRACT

The present invention relates to an organic electroluminescent device comprising a first electrode, at least one second electrode, at least one emission layer and at least one electron transport region, wherein the emission layer and the electron transport region are arranged between the at least one second electrode and the first and the electron transport region is arranged between the emission layer and the at least one second electrode, wherein the at least one electron transport region comprises a first electron transport layer, the first electron transport layer preferably not comprising an n-type dopant; and a performance enhancement layer, the performance enhancement layer having a refractive index of ≤1.6 at a wavelength of 1,200 nm; wherein the first electron transport layer is arranged between the emission layer and the performance enhancement layer; and the performance enhancement layer is arranged between the first electron transport layer and the at least one second electrode.

12 Claims, 2 Drawing Sheets

(52) U.S. Cl.
CPC ........ *H01L 51/009* (2013.01); *H01L 51/0054* (2013.01); *H01L 51/0061* (2013.01); *H01L 51/0067* (2013.01); *H01L 51/0072* (2013.01); *H01L 51/0073* (2013.01); *H01L 51/508* (2013.01); *H01L 51/5016* (2013.01); *H01L 51/5064* (2013.01); *H01L 51/5076* (2013.01); *H01L 51/5092* (2013.01); *H01L 51/5296* (2013.01); *H01L 2251/301* (2013.01)

(58) Field of Classification Search
CPC ................... H01L 51/0067; H01L 51/0072; H01L 51/009
See application file for complete search history.

(56) References Cited

U.S. PATENT DOCUMENTS

| | | | | |
|---|---|---|---|---|
| 10,381,566 | B2* | 8/2019 | Yokoyama | H01L 51/50 |
| 2007/0114919 | A1* | 5/2007 | Sotoyama | C09K 11/616 |
| | | | | 313/504 |
| 2009/0066234 | A1* | 3/2009 | Chae | B82Y 20/00 |
| | | | | 313/504 |
| 2010/0063221 | A1* | 3/2010 | Manabe | C08G 77/04 |
| | | | | 525/474 |
| 2012/0142793 | A1* | 6/2012 | Frey | C07F 7/21 |
| | | | | 521/50.5 |
| 2013/0285027 | A1* | 10/2013 | Loebl | H01L 51/508 |
| | | | | 257/40 |
| 2015/0372258 | A1* | 12/2015 | Mizuno | H01L 51/5092 |
| | | | | 257/40 |
| 2017/0133631 | A1* | 5/2017 | Thompson | H01L 51/5262 |
| 2017/0338431 | A1* | 11/2017 | Ro | H01L 51/0072 |

OTHER PUBLICATIONS

Salehi et al., "Highly Efficient Organic Light-Emitting Diode Using a Low Retractive Index Electron Transport Layer," Ad. Optical Mater., 2017, 1700197 (7 pages).

Shin et al., "Sky-Blue Phosphorescent OLEDs with 34.1% External Quantum Efficiency Using a Low Refractive Index Electron Transporting Layer," Adv. Mater., 2016, 28:4920-4925.

German Office Action for DE Application No. 10 2017 111 137.9 dated Oct. 22, 2020 (8 pages).

* cited by examiner

ORGANIC ELECTROLUMINESCENT DEVICE

CROSS REFERENCE TO RELATED APPLICATIONS

This application claims priority to German Application No. 102017111137.9, filed May 22, 2017, which is incorporated herein by reference.

The present invention relates to an organic electroluminescent device.

DESCRIPTION OF RELATED ART

The efficiency of extraction of the light for an OLED is only 25% of the total light generated in the OLED device. Improved light extraction efficiency of OLED devices can be obtained by making use of low refractive index materials as known from the literature. It is known that rather high concentrations of low refractive index materials (50%) are needed to significantly lower the effective refractive index of organic layers and sensibly increase the light extraction efficiency.

On the other hand, incorporating a high concentration of low refractive index material into a charge transport layers likely induces a strong penalty in the charge transporting properties of these layers, resulting in higher voltage, reduced efficiency, and eventually lower operational stability of the OLED device.

The usage of low refractive index materials is described in US 2007/114919 demonstrating the effect of low refractive index materials in p-doped hole-transport layers and emission layers. Here, the improved efficiency goes along with an increased voltage of the OLED device. Information on device durability and lifetime is not given in US 2007/114919. Furthermore, no example of application to the electron transport region is found in US 2007/114919.

The usage of silsesquioxanes as low refractive index materials in OLEDs is described in WO 2002/1005971. However, in WO 2002/1005971 neither electron transport nor redoxdoping of the low refractive index layer is disclosed. Fluorinated silsesquioxane are disclosed in conjunction with lamination coating for solar cells in WO 2012/053414 and in conjunction with electrolyte or electrode components for solid state battery in WO 2016/017527.

SUMMARY

It is, therefore, an object of the present invention to provide an organic electroluminescent device overcoming drawbacks of the prior art, in particular an organic electroluminescent device comprising high concentrations of low refractive index materials but avoiding at the same time disadvantages in charge transporting properties, higher voltage, reduced efficiency and lower operational stability and durability.

This object is achieved by an organic electroluminescent device comprising a at least one second electrode, a first electrode, at least one emission layer and at least one electron transport region, wherein the emission layer and the electron transport region are arranged between the first electrode and the at least one second electrode and the electron transport region is arranged between the emission layer and the at least one second electrode, wherein the at least one electron transport region comprises a) a first electron transport layer, the first electron transport layer preferably not comprising an n-type dopant; and b) a performance enhancement layer, the performance enhancement layer having a refractive index of ≤1.6 at a wavelength of 1,200 nm; wherein the first electron transport layer is arranged between the emission layer and the performance enhancement layer; and the performance enhancement layer is arranged between the first electron transport layer and the at least one second electrode.

In case of an organic electroluminescent device having only one first electrode and only one second electrode, such as an organic light emitting diode, the first electrode may be an anode and the second electrode may be a cathode. In case of an organic electroluminescent device having more than two electrodes, such as an organic electroluminescent transistor, the first electrode may be the gate electrode (control electrode), one of the second electrodes may be the source electrode (electron electrode) and another of the second electrodes may be the drain electrode (hole electrode).

In a further embodiment, the organic electroluminescent device further comprises at least one hole transport region. In one embodiment, the hole transport region is arranged between the first electrode and the at least one second electrode. In a further embodiment, the hole transport region is arranged between the first electrode and the emission layer. According to a further embodiment, the emission layer is arranged between the hole transport region and the electron transport region.

In one embodiment the electron transporting region further comprises an electron injection interlayer, wherein the electron injection interlayer is arranged between the first electron transport layer and the performance enhancement layer.

In a further embodiment the organic electroluminescent device is an organic light emitting diode or an organic electroluminescent transistor.

In another embodiment the performance enhancement layer comprises a low refractive material selected from the group consisting of silsesquioxanes, alkanes, perfluoroalkanes, perfluoroalkyl phosphonic acids, perfluorophosphine oxides and metal fluorides.

In a further embodiment the silsesquioxane is represented by the general formula $Si_xR_xO_{1.5x}$, wherein R is a hydrocarbyl group which may comprise at least one heteroatom selected from the group consisting of B, Si, N, P, O and S and/or which may comprise at least one substituent which is a halogen atom; and x is selected from 6, 8, 10, 12, 14 and 16.

In one embodiment the alkane is selected from alkane having 18 to 60 carbon atoms.

In another embodiment the metal fluoride is selected from LiF, NaF, KF or mixtures thereof.

In a further embodiment the low refractive material is selected from

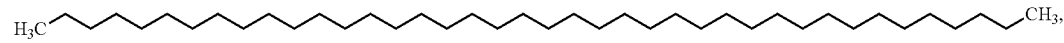

-continued
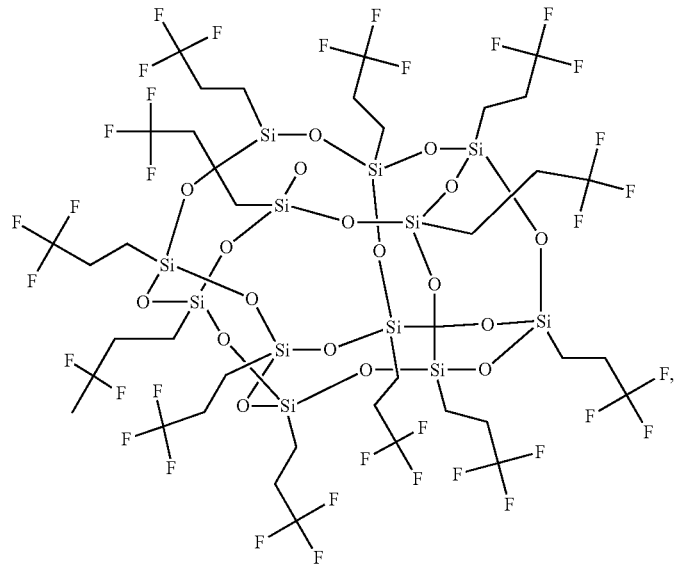
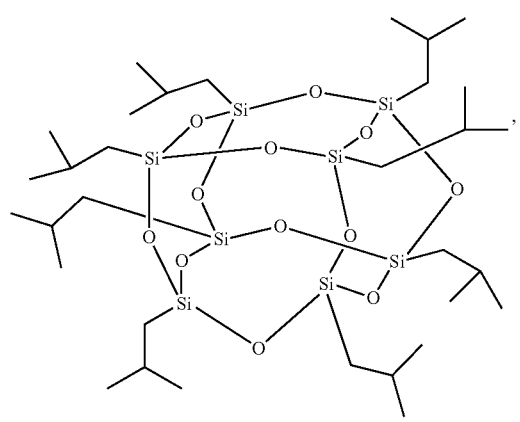
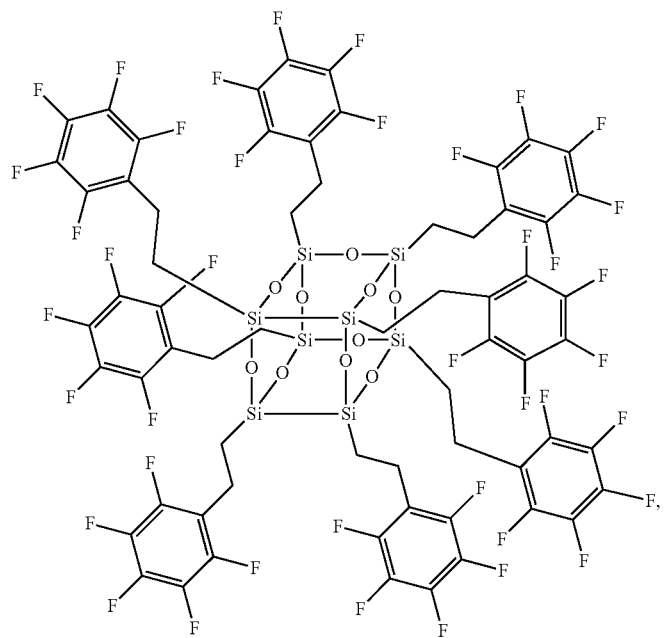
LiF, or mixtures thereof.

In another embodiment the performance enhancement layer further comprises an n-type dopant, wherein the n-type dopant is selected from alkali metal, alkaline earth metal, rare earth metal, organic complexes thereof or halides thereof or is a compound represented by one of the following formulae

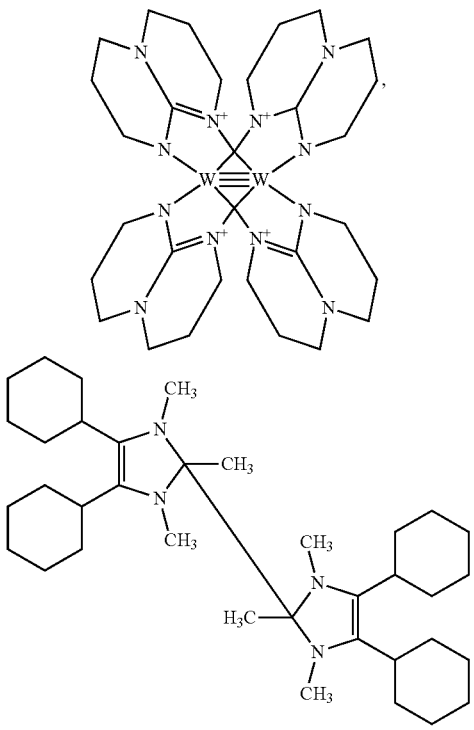

or mixtures thereof.

In another embodiment the organic electroluminescent device comprises, in this order, a first electrode, a p-type doped hole transport layer, optionally a first hole transport layer, optionally a second hole transport layer, the emission layer, the first electron transport layer, optionally the electron injection interlayer, the performance enhancement layer and the at least one second electrode, wherein the election injection interlayer may be an n-type doped electron transport layer.

Figure 1:
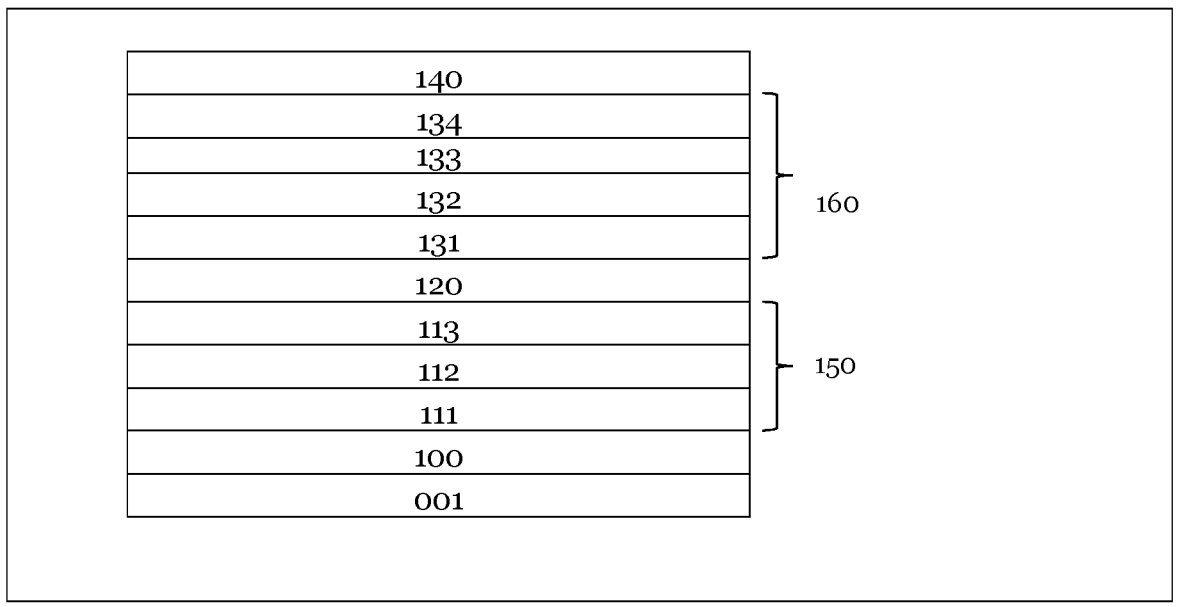
FIG. 1—Definition of Layers in an OLED. The sequence and number of layers in FIG. 1 is exemplary for one embodiment of the invention.
Figure 2:
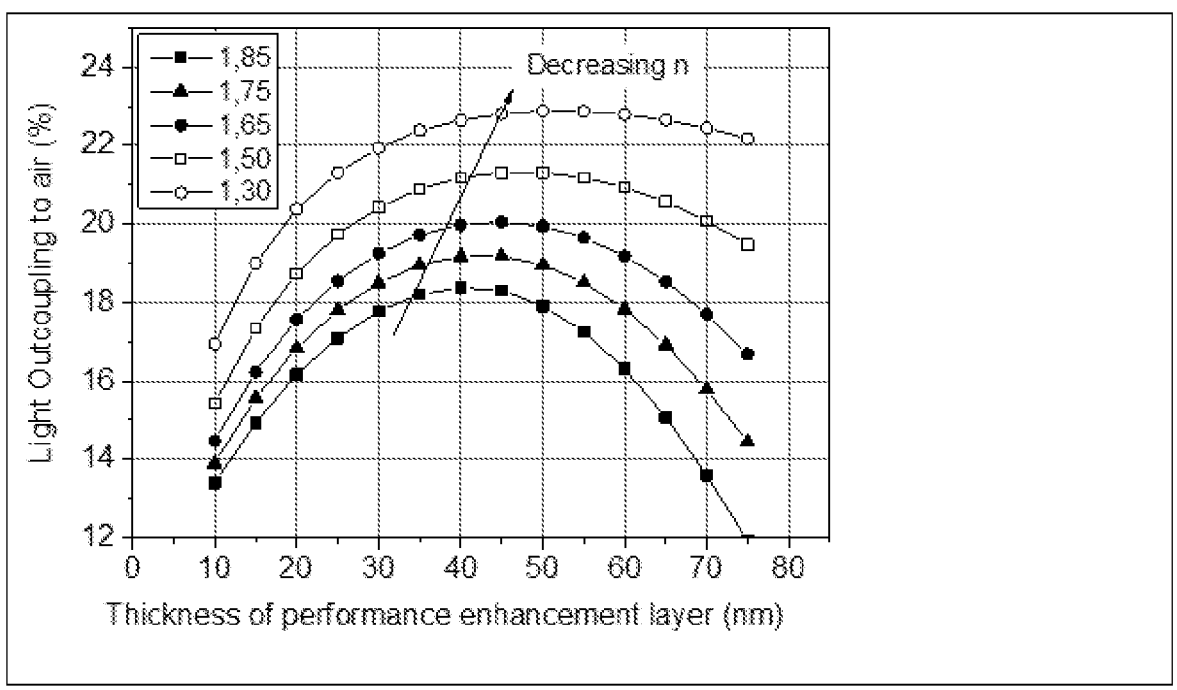
FIG. 2—Simulation experiments show that the efficiency of light outcoupling from an OLED increases with decreasing refractive index of the performance enhancement layer. The simulation method is the dipole emission model with transfer matrices using the "emissive thin-film optics simulator (ETFOS)" developed by Zurich University of Applied Sciences. The refractive index of the performance enhancement layer was varied between 1.30 and 1.85. The OLED layer stack is derived from the arrangement in Table 3. The OLED is a bottom emission device with the first electrode in direct contact with a glass substrate (refractive index n=1.5) through which the light outcoupling occurs.
Figure 3:
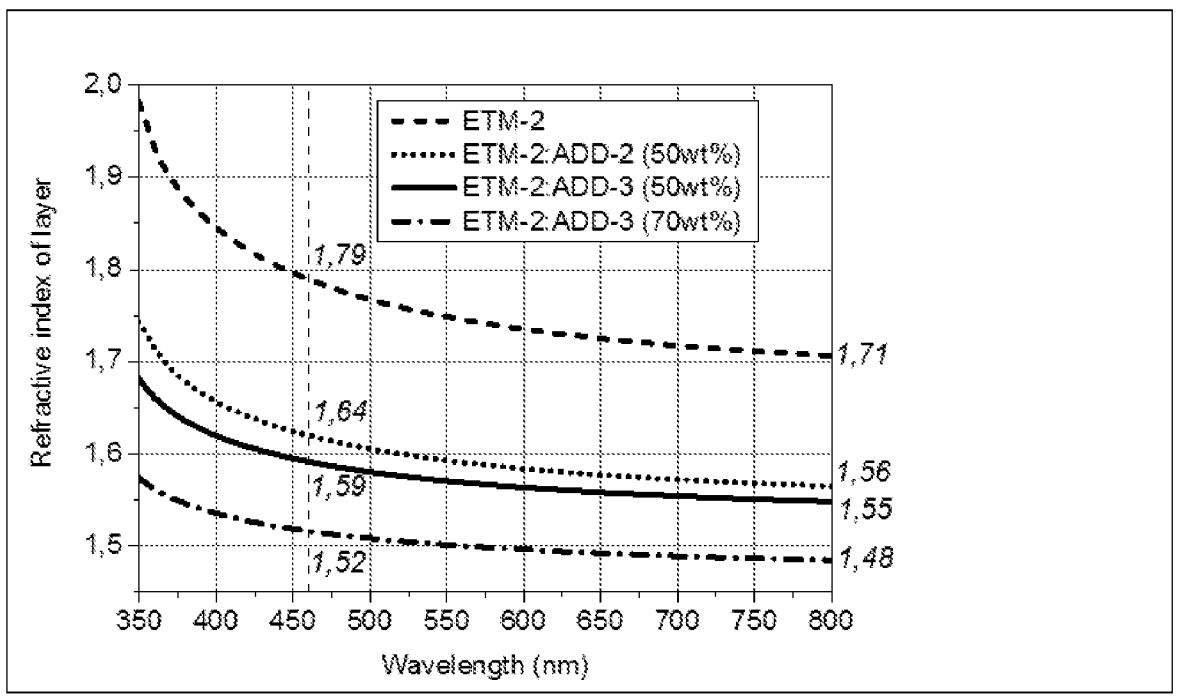
FIG. 3—Refractive index of performance enhancement layers without LRIC and with increasing amounts of LRIC in the performance enhancement layer. The highest amount of LRIC results in the lowest refractive index, as measured by VASE using spectroscopic ellipsometer, Woolam Inc.

Besides the constituents (that is, layers and materials for preparing the same) listed above, the inventive organic electroluminescent device may comprise further constituents, such as a substrate, a hole transport region, a hole injection layer, a p-type dopant, an electron transport matrix compound, an electron injection layer, and the like. Further details as to possible respective embodiments, in particular suitable arrangements of the above components to form the inventive organic electroluminescent device, will be explained in the following sections. Reference will be made in this regard to the accompanied FIG. 1, schematically showing a possible arrangement of an inventive organic electroluminescent device. However, the person skilled in the art is aware of the fact that the embodiment shown in FIG. 1 is only of exemplary nature and that different arrangements are possible in which further constituents are present or some of the (non-essential) constituents are omitted.

In FIG. 1, the reference signs are assigned to the different layers of the organic electroluminescent device as follows:
001—Substrate
100—First Electrode
111—Hole Injection Layer (HIL)
112—First Hole Transport Layer (First HTL)
113—Second Hole Transport Layer (Second HTL)
120—Emission Layer (EML)
131—First Electron Transport Layer (First ETL)
132—Electron Injection Interlayer (EIIL)
133—Performance Enhancement Layer (PEL)
134—Electron Injection Layer (EIL)
140—At least one second electrode
150—Hole-transport region
160—Electron transport region Substrate The substrate (001) may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

First Electrode

The first electrode (100) may be formed by depositing or sputtering a compound that is used to form the first electrode. The compound used to form the first electrode may be a high work-function compound, so as to facilitate hole injection. The first electrode may also be selected from a low work function material (i.e. aluminum, silver) so as to facilitate electron injection. The first electrode may be an anode. The first electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the first electrode 100. The first electrode 100 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The first electrode 100 may be formed from a high conductivity metal, for example copper (Cu) or silver (Ag).

Hole Transport Region

The hole transport region (150) may comprise a hole injection layer (111), a first hole transport layer (112) and/or second hole transport layer (113).

Hole Injection Layer (HIL)

Hole injection layers (111) suitable for an organic electroluminescent device of the present invention, such as an OLED, are described in US 2002/158242 A, EP 1 596 445 A1 and EP 1 988 587 A1.

An HIL may be formed on the first electrode by vacuum deposition, spin coating, printing, casting, slot-die coating, Langmuir-Blodgett (LB) deposition, or the like.

When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^8$ to $10^3$ torr (1 torr equals 133.322 Pa or 1.33322 mbar), and a deposition rate of 0.1 to 10 nm/sec.

When the HIL is formed using deposition from solution the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may comprise or consist of p-type dopant and the p-type dopant may be selected from tetrafluoro-tetracyanoquinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl)acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. The p-type dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

In an embodiment the HIL comprises a hole transport material and a p-type dopant.

In another embodiment the HIL consists of the p-type dopant.

p-Type Dopant

The p-dopant may be one of a quinone derivative, a radialene compound, a metal oxide, a metal complex and a cyano group-containing compound, but is not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), radialene compounds like PD-1 and the like; metal oxides such as tungsten oxide, molybdenum oxide, and the like; metal complexes such as Molybdenum tris-[1,2-bis(trifluoromethyl)ethane-1,2-dithiolene] (Mo(tfd)$_3$) and the like; and cyano-containing compounds such as compound PD-2 below.

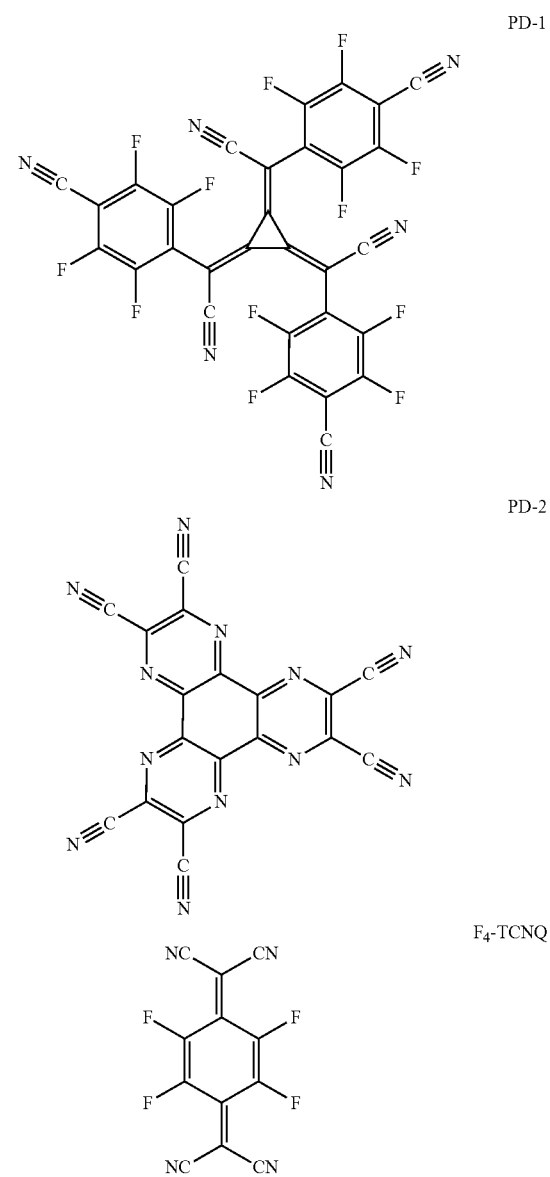

In a further embodiment the p-type dopant may be a neutral metal amide compound as described in WO 2017/029370 and WO 2017/029366.

Hole Transport Layer (HTL)

The hole transport layers (i.e. in particular the first hole transport layer and the second hole transport layer) may comprise hole transport materials. Compounds that may be used are disclosed for example in Yasuhiko Shirota and Hiroshi Kageyama, Chem. Rev. 2007, 107, 953-1010, and incorporated by reference.

In an embodiment the hole transport layers may comprise a p-type dopant.

A first hole transport layer (112) may be formed on the HIL by vacuum deposition, spin coating, slot-die coating, printing, casting, Langmuir-Blodgett (LB) deposition, or the like.

In an embodiment the first hole transport layer may be in direct contact with the HIL.

In an embodiment the first hole transport layer may be in direct contact with the second hole transport layer.

In another embodiment the first hole transport layer may be in direct contact with the emission layer.

In a preferred embodiment the first hole transport layer is free of a p-type dopant.

A second hole transport layer (113) may be formed on the first hole transport layer (113) by vacuum deposition, spin coating, slot-die coating, printing, casting, Langmuir-Blodgett (LB) deposition, or the like.

In an embodiment the second hole transport layer may be in direct contact with the HIL.

In an embodiment the second hole transport layer may be in direct contact with the first hole transport layer.

In another embodiment the second hole transport layer may be in direct contact with the emission layer.

In a preferred embodiment the second hole transport layer is free of a p-type dopant.

When the respective hole transport layer is formed by vacuum deposition or spin coating, the conditions for deposition and coating may be similar to those for the formation of the hole injection layer. However, the conditions for the vacuum or solution deposition may vary, according to the compound that is used to form the respective hole transport layer.

In an embodiment the first hole transport layer (112) and/or the second hole transport layer (113) may act as an electron blocking layer. The function of the electron blocking layer (EBL) is to prevent electrons from being transferred from the emission layer to the hole transport layer and thereby confine electrons to the emission layer. Thereby, efficiency, operating voltage and/or lifetime are improved.

Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyetriphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

The function of an electron blocking layer (EBL) is to prevent electrons from being transferred from an emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1, and fully incorporated by reference.

Emission Layer (EML)

The emission layer (120) may be formed on the first hole transport layer (112) or the second hole transport layer (113) by vacuum deposition, spin coating, slot-die coating, printing, casting, LB, or the like. When the EML is formed using vacuum deposition or spin coating, the conditions for deposition and coating may be similar to those for the formation of the HIL.

However, the conditions for deposition and coating may vary, according to the compound that is used to form the EML.

The emission layer (EML) may be formed of a combination of a host and an emitter dopant. In a preferred embodiment the emission layer consists of a host and an emitter dopant.

It may be provided that the emission layer does not comprise the compound of Formula (I).

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA) and bis(2-(2-hydroxyphenyl)benzothiazolate)zinc (Zn(BTZ)2).

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

Examples of phosphorescent green emitter dopants are Ir(ppy)3 (ppy=phenylpyridine), Ir(ppy)2(acac), Ir(mpyp)3.

Examples of phosphorescent blue emitter dopants are F2Irpic, (F2ppy)2Ir(tmd) and Ir(dfppz)3 and ter-fluorene. 4.4'-bis(4-diphenyl amiostyryl)biphenyl (DPAVBi), 2,5,8, 11-tetra-tert-butyl perylene (TBPe) are examples of fluorescent blue emitter dopants.

The amount of the dopant may be in the range of about 0.01 to about 50 parts by weight, based on 100 parts by weight of the host.

Alternatively, the emission layer may comprise a or consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

In a preferred embodiment the emission layer comprising, or consisting of, the light-emitting polymer is in direct contact with the electron transport region.

In a preferred embodiment the emission layer comprising the or consisting of the light-emitting polymer is in direct contact with the hole transport region.

Electron Transport Region

The electron transport region (160) of the stack of layers in an OLED may be disposed on the emission layer (120). The electron transport region (160) comprises a first electron transport layer (131) and a performance enhancement layer (133). In an embodiment the electron transport region (160) may additionally comprise an electron injection interlayer (132).

In a preferred embodiment the electron injection interlayer (132) may be in direct contact with the first electron transport layer (131) and in direct contact with the performance enhancement layer (133).

In another embodiment the electron transport region (160) may comprise an electron injection layer (134).

In an embodiment the electron injection layer (134) is in direct contact with the at least one second electrode.

First Electron Transport Layer (first ETL)

A first electron transport layer (131) may be formed on the EML by using vacuum deposition, spin coating, slot-die coating, printing, casting, LB deposition, or the like, in order to prevent the diffusion of holes into the ETL. The first ETL may act as a hole-blocking layer (HBL). When the EML comprises a phosphorescent dopant, the HBL may have also a triplet exciton blocking function in order to prevent the diffusion of triplet excitons into the electron transport region.

In a preferred embodiment the first electron transport layer is free of an n-type dopant.

The first electron transport layer may act as a hole blocking layers in the OLED of the present invention as described in US 2015/207093A and US 2015/060794 A, fully incorporated herein by reference.

When the first electron transport layer is formed using vacuum deposition or spin coating, the conditions for deposition and coating may be similar to those for the formation of the HIL (111). However, the conditions for deposition and coating may vary, according to the compound that is used to form the first electron transport layer. Any compound that is commonly used to form a first electron transport layer may be used. Examples of compounds for forming the first electron transport layer include an oxadiazole derivative, a triazole derivative, a triazine derivative, an acridine derivative, and a phenanthroline derivative.

In an embodiment the compound for forming the first electron transport layer is a 1,3,5-substituted triazine derivative.

If the first electron transport layer has a high triplet level, it may also be described as triplet control layer. The function of the triplet control layer is to reduce quenching of triplets if a phosphorescent green or blue emission layer is used. Thereby, higher efficiency of light emission from a phosphorescent emission layer can be achieved. The triplet control layer is selected from a heteroaryl compound with a triplet level above the triplet level of the phosphorescent emitter in the adjacent emission layer.

In an embodiment the first electron transport layer may be formed on the emission layer.

In a preferred embodiment the first electron transport layer may be in direct contact with the emission layer.

The first electron transport layer may have a thickness of about 5 nm to about 100 nm, for example, about 10 nm to about 30 nm. When the thickness of the first electron transport layer is within this range, the first electron transport layer may have excellent hole-blocking properties, without a substantial increase in driving voltage.

In an embodiment the first ETL comprises an electron transport layer stack comprising two or more individual electron transport layers.

n-Type Dopant

Under n-type dopant, it is understood a compound which, if embedded into an electron transport or electron injection layer, increases the concentration of free electrons in comparison with the neat matrix under the same physical conditions in a way that the conductivity of a layer comprising the n-type dopant is higher than the conductivity of the neat matrix layer.

The n-type dopant does not emit light under the operation condition of an electroluminescent device, for example an OLED. In one embodiment, the n-type dopant is selected from an electrically neutral metal complex and/or an electrically neutral organic radical.

The most practical benchmark for the strength of an n-type dopant is the value of its redox potential. There is no particular limitation in terms how negative the value of the redox potential can be.

As redox potentials of usual electron transport matrices used in organic light emitting diodes are, if measured by cyclic voltammetry against ferrocene/ferrocenium reference redox couple, roughly in the range from about −1.8 V to about −3.1V; the practically applicable range of redox potentials for n-type dopants which can effectively n-dope such matrices is in a slightly broader range, from about −1.7 V to about −3.3 V.

The measurement of redox potentials is practically performed for a corresponding redox couple consisting of the reduced and of the oxidized form of the same compound.

In case that the n-type dopant is an electrically neutral metal complex and/or an electrically neutral organic radical, the measurement of its redox potential is actually performed for the redox couple formed by (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

Preferably, the redox potential of the electrically neutral metal complex and/or of the electrically neutral organic radical may have a value which is more negative than −1.7 V, preferably more negative than −1.9 V, more preferably more negative than −2.1 V, even more preferably more negative than −2.3 V, most preferably more negative than −2.5 V, if measured by cyclic voltammetry against ferrocene/ferrocenium reference redox couple for a corresponding redox couple consisting of (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

In a preferred embodiment, the redox potential of the n-type dopant is between the value which is about 0.5 V more positive and the value which is about 0.5 V more negative than the value of the reduction potential of the chosen electron transport matrix.

Electrically neutral metal complexes suitable as n-type dopants may be e.g. strongly reductive complexes of some transition metals in low oxidation state. In an embodiment the n-type dopant may be selected from Cr(II), Mo(II) and/or W(II) guanidinate complexes such as W2(hpp)4, as described in more detail in WO 2005/086251.

Electrically neutral organic radicals suitable as n-type dopants may be e.g. organic radicals created by supply of additional energy from their stable dimers, oligomers or polymers, as described in more detail in EP 1 837 926 B1, WO 2007/107306, or WO 2007/107356. Specific examples of such suitable radicals may be diazolyl radicals, oxazolyl radicals and/or thiazolyl radicals.

Elemental metals are suitable as n-type dopants. Under an elemental metal it is understood a metal in a state of a neat metal, of a metal alloy, or in a state of free atoms or metal clusters. It is understood that metals deposited by vacuum thermal evaporation from a metallic phase, e.g. from a neat bulk metal, vaporize in their elemental form. It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

For the use in consumer electronics, only metals containing stable nuclides or nuclides having very long halftime of radioactive decay might be applicable. As an acceptable level of nuclear stability, the nuclear stability of natural potassium can be taken.

In one embodiment, the n-type dopant is selected from electropositive metals selected from alkali metals, alkaline earth metals, rare earth metals and metals of the first transition period Ti, V, Cr and Mn. Preferably, the n-type dopant is selected from Li, Na, K, Rb, Cs, Mg, Ca, Sr, Ba, Sm, Eu, Tm, Yb; more preferably from Li, Na, K, Rb, Cs, Mg, Ca and Yb, even more preferably from Li, Mg, Ca and Yb.

The n-type dopant may be essentially non-emissive.

Electron Transport Matrix Compound

Various embodiments of the electron transport region in the device according to invention, e.g. devices comprising hole blocking layers, electron injection layers, may comprise an electron transport matrix compound.

The electron transport matrix is not particularly limited. Similarly as other materials which are in the inventive device comprised outside the emitting layer, the electron transport matrix may not emit light.

According to one embodiment, the electron transport matrix can be an organic compound, an organometallic compound, or a metal complex.

According to one embodiment, the electron transport matrix may be a covalent compound comprising a conjugated system of at least 6 delocalized electrons. Under a covalent material in a broadest possible sense, it might be understood a material, wherein at least 50% of all chemical bonds are covalent bonds, wherein coordination bonds are also considered as covalent bonds. In the present application, the term encompasses in the broadest sense all usual electron transport matrices which are predominantly selected from organic compounds but also e.g. from compounds comprising structural moieties which do not comprise carbon, for example substituted 2,4,6-tribora-1,3,5 triazines, or from metal complexes, for example aluminium tris(8-hydroxyquinolinolate).

The molecular covalent materials can comprise low molecular weight compounds which may be, preferably, stable enough to be processable by vacuum thermal evaporation (VTE). Alternatively, covalent materials can comprise polymeric covalent compounds, preferably, compounds soluble in a solvent and thus processable in form of a solution. It is to be understood that a polymeric substantially covalent material may be crosslinked to form an infinite irregular network, however, it is supposed that such crosslinked polymeric substantially covalent matrix compound still comprises both skeletal as well as peripheral atoms. Skeletal atoms of the covalent compound are covalently bound to at least two neighbour atoms. Other atoms of the covalent compound are peripheral atoms which are covalently bound with a single neighbour atom. Inorganic infinite crystals or fully crosslinked networks having partly covalent bonding but substantially lacking peripheral atoms, like silicon, germanium, gallium arsenide, indium phosphide, zinc sulfide, silicate glass etc. are not considered as covalent matrices in the sense of present application, because such fully crosslinked covalent materials comprise peripheral atoms only on the surface of the phase formed by such material. A compound comprising cations and anions is still considered as covalent, if at least the cation or at least the anion comprises at least ten covalently bound atoms.

Preferred examples of covalent electron transport matrix compounds are organic compounds, consisting predominantly from covalently bound C, H, O, N, S, which may optionally comprise also covalently bound B, P, As, Se. In one embodiment, the electron transport matrix compound lacks metal atoms and majority of its skeletal atoms is selected from C, O, S, N.

In another embodiment, the electron transport matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from 0, S, Se, Te or by a trivalent atom selected from N, P, As, Sb, Bi. Preferably, the conjugated system of delocalized electrons comprises at least one aromatic or heteroaromatic ring adhering to the Hückel rule. Also preferably, the electron transport matrix compound may comprise at least two aromatic or heteroaromatic rings which are either linked by a covalent bond or condensed.

In one embodiment the electron transport matrix compound comprises a ring consisting of covalently bound atoms and at least one atom in the ring is phosphorus.

In preferred embodiment, the phosphorus-containing ring consisting of covalently bound atoms is a phosphepine ring.

In another preferred embodiment, the electron transport matrix compound comprises a phosphine oxide group.

In another preferred embodiment the electron transport matrix compound comprises a diazole group.

Also preferably, the substantially covalent matrix compound may comprise a heterocyclic ring comprising at least one nitrogen atom. Examples of nitrogen containing heterocyclic compounds which are particularly advantageous as electron transport matrix compound for the inventive device are matrices comprising, alone or in combination, pyridine structural moieties, diazine structural moieties, triazine structural moieties, quinoline structural moieties, benzoquinoline structural moieties, quinazoline structural moieties, acridine structural moieties, benzacridine structural moieties, dibenzacridine structural moieties, diazole structural moieties and benzodiazole structural moieties.

The electron matrix compound may have a molecular weight (Mw) of ≥400 to 850 g/mol, preferably ≥450 to ≤830 g/mol. If the molecular weight is selected in this range, particularly reproducible evaporation and deposition can be achieved in vacuum at temperatures where good long-term stability is observed. Preferably, the matrix compound may be essentially non-emissive.

Electron Injection Interlayer (EIIL)

When the electron injection interlayer (132) may be formed using vacuum deposition or spin coating, the conditions for deposition and coating may be similar to those for the formation of the HIL (111). However, the conditions for deposition and coating may vary, according to the compounds that are used to form the performance enhancement layer.

The electron injection interlayer may comprise at least one electron transport matrix compound and at least one n-type dopant.

In an embodiment the electron transport matrix compound comprises at least one diazole group.

In a preferred embodiment the electron transport matrix compound comprises at least one phosphine oxide group.

In an embodiment the n-type dopant may be selected from alkali metal, alkaline earth metal, rare earth metal, organic complexes thereof, or electrically neutral transition metal complexes.

In one embodiment, the n-type dopant is selected from electropositive metals selected from alkali metals, alkaline earth metals, rare earth metals and metals of the first transition period Ti, V, Cr and Mn. Preferably, the n-type dopant is selected from Li, Na, K, Rb, Cs, Mg, Ca, Sr, Ba, Sm, Eu, Tm, Yb; more preferably from Li, Na, K, Rb, Cs, Mg, Ca and Yb, even more preferably from Li, Mg, Ca and Yb.

In an embodiment the concentration of the electropositive metal in the electron transport matrix compound is in the range from about 0.5 weight % up to about 25 weight %, preferably in the range from about 1 to about 20 weight %, more preferably in the range from about 2 to about 15 weight %, most preferably in the range from about 3 to about 10 weight %.

In another embodiment the n-type dopant may be selected from complexes of transition metals in low oxidation state such as Cr(II), Mo(II) and/or W(II) guanidinate complexes.

In another embodiment the n-type dopant is selected from or is a compound represented by one of the following formulae

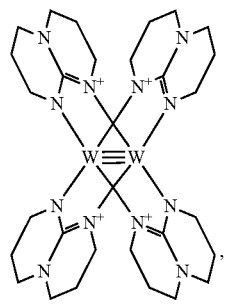

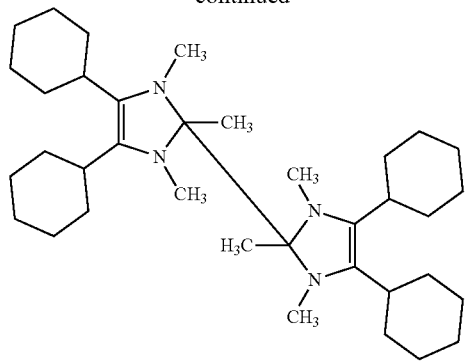

or mixtures thereof.

In an embodiment the thickness of the EIIL (132) is larger than about 0.1 nm and lower that 50 nm, preferably larger than 0.5 nm and lower than 30 nm, even more preferably larger than 1 nm and lower than 25 nm.

In an embodiment the EIIL (132) is arranged between the first electron transport layer (131) and the performance enhancement layer (133).

In a further embodiment the EIIL (132) is arranged in direct contact with the first electron transport layer (131).

In another embodiment the EIIL (132) is arranged in direct contact with the performance enhancement layer (133).

Performance Enhancement Layer (PEL)

The performance enhancement layer may be any layer having a refractive index of about ≤1.6 measured by ellipsometry at a wavelength of 1200 nm.

When the performance enhancement layer (133) is formed using vacuum deposition or spin coating, the conditions for deposition and coating may be similar to those for the formation of the HIL (111). However, the conditions for deposition and coating may vary, according to the compounds that are used to form the performance enhancement layer.

In an embodiment the performance enhancement layer may comprise at least one electron transport matrix compound and at least one low refractive index compound (LRIC).

In a preferred embodiment the performance enhancement layer may comprise at least one electron transport matrix compound, at least one LRIC and at least one n-type dopant.

In an embodiment the electron transport matrix compound comprises at least one diazole group.

In a preferred embodiment the electron transport matrix compound comprises at least one phosphine oxide group.

In an embodiment the n-type dopant may be selected from alkali metal, alkaline earth metal, rare earth metal, organic complexes thereof, or electrically neutral transition metal complexes.

In one embodiment, the n-type dopant is selected from electropositive metals selected from alkali metals, alkaline earth metals, rare earth metals and metals of the first transition period Ti, V, Cr and Mn. Preferably, the n-type dopant is selected from Li, Na, K, Rb, Cs, Mg, Ca, Sr, Ba, Sm, Eu, Tm, Yb; more preferably from Li, Na, K, Rb, Cs, Mg, Ca and Yb, even more preferably from Li, Mg, Ca and Yb.

In another embodiment the n-type dopant may be selected from complexes of transition metals in low oxidation state such as Cr(II), Mo(II) and/or W(II) guanidinate complexes.

In another embodiment the n-type dopant is selected from or is a compound represented by one of the following formulae

[Chemical structures shown]

or mixtures thereof.

The performance enhancement layer may have a refractive index of 1.6 or less when measured by ellipsometry at a wavelength of 1200 nm.

In a preferred embodiment the refractive index of the performance enhancement layer is 1.6 or less and larger than 1.0 when measured by ellipsometry at a wavelength of 1200 nm.

In a more preferred embodiment the refractive index of the performance enhancement layer is 1.58 or less and larger than 1.05 when measured by ellipsometry at a wavelength of 1200 nm.

In a further preferred embodiment the refractive index of the performance enhancement layer is 1.55 or less and larger than 1.05 when measured by ellipsometry at a wavelength of 1200 nm.

In an embodiment the performance enhancement layer is arranged between the first electrode and the at least one second electrode.

In an embodiment the performance enhancement layer is arranged between the first electron transport layer and the at least one second electrode.

In another embodiment the performance enhancement layer is arranged in direct contact with the first electron transport layer (131).

In an embodiment the performance enhancement layer is arranged in direct contact with the electron injection interlayer (132).

In another embodiment the performance enhancement layer is arranged in direct contact with the electron injection layer (134).

In a further embodiment the performance enhancement layer is arranged in direct contact with the at least one second electrode.

In an embodiment the content of the LRIC in the performance enhancement layer is larger than 5% by mass and lower than 95% by mass.

In a further embodiment the content of the LRIC in the performance enhancement layer is larger than 10% by mass and lower than 90% by mass.

In another embodiment the content of the LRIC in the performance enhancement layer is larger than 20% by mass and lower than 80% by mass.

In an embodiment the content of the n-type dopant in the performance enhancement layer is larger than 0.1% by mass and lower than 30% by mass.

In a further embodiment the content of the n-type dopant in the performance enhancement layer is larger than 1% by mass and lower than 20% by mass.

In another embodiment the content of the n-type dopant in the performance enhancement layer is larger than 2% by mass and lower than 15% by mass.

In an embodiment the thickness of the performance enhancement layer (133) is larger than about 0.1 nm and lower that 150 nm, preferably larger than 1 nm and lower than 100 nm, even more preferably larger than 10 nm and lower than 100 nm.

Low Refractive Index Compound (LRIC)

The low refractive index compound according to the present invention may be an inorganic material or an organic material.

Examples of inorganic materials which may be used for the LRIC include metal oxides, metal fluorides, silicon oxides, and metal oxide-silicon oxide mixtures. Metal fluorides are a preferred embodiment.

Inorganic LRIC may be selected from the group of $AlF_3$, $MgF_2$, $Na_3AlF_6$, $CaF_2$, $BaF_2$, $SrF_2$, LiF, NaF, KF, CsF, $Na_{2O}$, $Li_{2O}$, $SiO_2$ and a mixture $SiO_2/Na_2O$ mixture. In a preferred embodiment inorganic LRIC are selected from $AlF_3$, $Na_3AlF_6$, $MgF_2$, $CaF_2$, $BaF_2$, $SrF_2$, LiF, NaF, KF, and CsF.

Examples of organic materials which may be used for the LRIC include fluorine-containing organic compounds, alkyl compounds, cycloalkyl compounds, cyclodextrins, cyclic ethers, catenanes, and cucurbituril.

In an embodiment the LRIC is a fluorine-containing organic compound.

Fluorine-containing organic LRIC may be selected from the group of perfluoroalkyl compounds, perfluoroalkylether compounds and the like. In an embodiment organic LRIC are perfluoroalkyl compounds.

In a further embodiment the organic LRIC is selected from perfluorododecane, perfluoro-2,7-dimethyloctane, perfluoro-2,11-dimethyldodecane, and difluoromethyl ether/tetrafluoroethyl ether copolymers.

In the present invention, an inorganic LRIC may be admixed with an organic LRIC. The mixing ratio is not particularly limited, and it may be arbitrarily selected in a range where a good mixture can be formed. In this respect, however, the refractive index of a mixture of LRIC depends on the mass ratio of the individual LRIC in the mixture. It is therefore advantageous that the content of the LRIC of the lower refractive index in the mixture is high.

In an embodiment the LRIC has a refractive index of 1.5 or less when measured by ellipsometry at a wavelength of 1200 nm.

In a preferred embodiment the LRIC has a refractive index of 1.4 or less when measured by ellipsometry at a wavelength of 1200 nm.

In a more preferred embodiment the LRIC has a refractive index of 1.3 or less when measured by ellipsometry at a wavelength of 1200 nm.

In an embodiment the LRIC is selected from the group of silsequioxanes.

In another embodiment the LRIC is a compound represented by the general formula $Si_xR_xO_{1.5x}$, wherein R is a hydrocarbyl group which may comprise at least one heteroatom selected from the group consisting of B, Si, N, P, O and S, the hydrocarbyl group comprising at least one aromatic of heteroaromatic moiety which is partially or fully substituted with at least one substituent, wherein the at least one substituent is selected from the group consisting of halogen and CN;

x is selected from 6, 8, to, 12, 14 and 16; and

In another preferred embodiment the LRIC is a compound represented by the general formula (I)

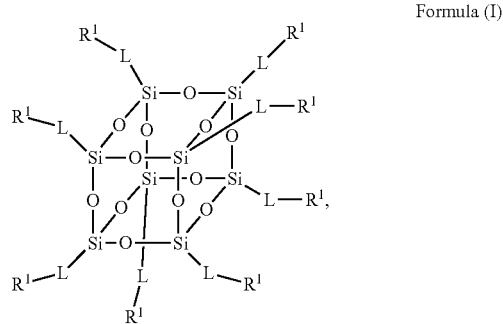

Formula (I)

wherein $R^1$ is a group having 2 to 20 carbon atoms and comprising at least one fluorinated or perfluorinated carbocycle of heterocarbocycle, wherein the fluorinated carbocycle or heterocarbocycle may be unsubstituted or substituted with at least one substituent, selected from the group consisting of alkyl, fluorinated alkyl and perfluorinated alkyl; wherein the number of carbon atoms referred to as 2 to 20 encompasses all carbon atoms including that of the substituents.

wherein the group $R^1$ may further comprise at least one heteroatom selected from the group, consisting of B, Si, N, P, O and S; and L is independently selected from $(CH_2)n$ and/or $(CF_2)m$ and/or $(C_zH_xF_y)$ wherein n and m are integer values$\geq 0$ x=2z-y and x is an integer$\geq 1$ y=2z-x and y is an integer$\geq 1$ z is an integer value$\geq 1$ In another embodiment the LRIC is selected from the group of alkanes or perfluoroalkanes, wherein the number of carbon atoms is 18 to 60, preferably 25 to 55, and more preferred 30 to 50.

In a further embodiment the LRIC is selected from compounds containing phosphorous, such as perfluoroalkyl phosphonic acids such as 1H,1H,2H,2H-Perfluorooctanephosphonic acid, perfluoro phosphine oxides such as tris (perfluorododecyl)phosphine oxide.

In a further embodiment the LRIC is selected from ADD-1, ADD-2, ADD-3, ADD-4 or ADD-5 (see Tab.1), or a mixture thereof.

Electron Injection Layer (EIL)

The organic light emitting diode may comprise an electron injection layer (134).

The optional EIL may facilitate injection of electrons into the electron transport region.

The electron injection layer may consist of at least one metal compound.

The metal compound can be selected from the group comprising a metal halide, a metal organic complex and/or a zero-valent metal.

Preferably, the metal compound is selected from the group comprising a metal halide, a metal organic complex and/or a zero-valent metal, preferably an alkali halide, alkali organic complex, more preferred an alkali halide, alkali organic complex, most preferred are lithium fluoride and lithium quinolate (LiQ).

The metal halide may be selected from the group comprising halide wherein the metal is selected from the group comprising Li, Na, K, Cs, Mg, Ca and Ba; and the halide is selected from the group comprising F, Cl, Br and I; and preferably a lithium halide.

The lithium halide may be selected from the group comprising a LiF, LiCl, LiBr or LiI, and preferably LiF.

The metal organic complex may be selected from the group of metal quinolate, a metal borate, a metal phenolate and/or a metal Schiff base.

Preferably the metal organic complex may be a lithium organic complex.

Preferably the lithium organic complex can be selected from the group of a lithium quinolate, a lithium borate, a lithium phenolate and/or a lithium Schiff base, preferably of a lithium quinolate complex has the formula I, II or III:

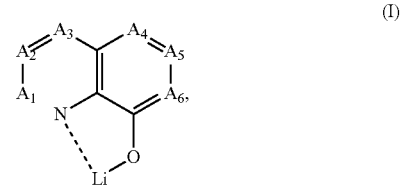

(I)

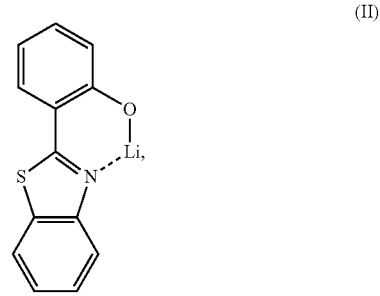

(II)

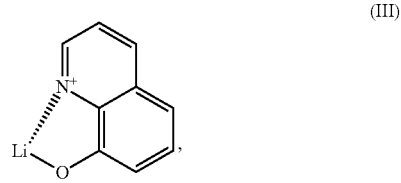

(III)

wherein $A_1$ to $A_6$ are same or independently selected from CH, CR, N, O, p R is same or independently selected from hydrogen, halogen, alkyl or aryl or heteroaryl with 1 to 20 carbon atoms, and more preferred of a lithium 8-hydroxyquinolate.

The zero-valent metal may be selected from the group comprising alkali metal, alkaline earth metal, rare earth metal and/or a group 3 transition metal, preferably the zero-valent metal is selected from the group comprising Li, Na, K, Rb, Cs, Mg, Ca, Sr, Ba, Yb, Sm, Eu, Nd, Tb, Gd, Ce, La, Sc and Y, more preferred the zero-valent metal is selected from the group comprising Li, Na, Mg, Ca, Ba, Yb, and further more preferred the zero-valent metal is selected from the group comprising Li, Mg, Ba, Yb.

Preferably, the electron injection layer is free of an electron transport matrix compound. Therefore, the electron injection layer is not an electron transport layer.

In an embodiment the electron injection layer is arranged between the performance enhancement layer and the cathode.

In a preferred embodiment the electron injection layer is arranged in direct contact with the cathode.

In another embodiment the electron injection layer is arranged in direct contact with the performance enhancement layer.

Deposition and coating conditions for forming the EIL are similar to those for formation of an hole injection layer (HIL), although the deposition and coating conditions may vary, according to a material that is used to form the EIL.

The thickness of the EIL may be in the range of about 1 nm to 10 nm. According to a preferred embodiment the electron injection layer may a thickness of about ≥1 nm and about ≤10 nm, preferably about ≥2 nm to about ≤6 nm, preferably of about ≥3 nm to about ≤5 nm and more preferred of about ≥3 nm to about ≤4 nm. When the thickness of the EIL is within this range, the EIL according to the invention may have improved electron-injecting properties, especially a substantial decrease in operating voltage and/or increase in external quantum efficiency EQE.

Preferably, an electron injection layer is present if the performance enhancement layer (133) does not contain an n-type dopant.

If the performance enhancement layer (133) does contain an n-type dopant, an electron injection layer (134) may not be present.

At Least One Second Electrode

The at least one second electrode, preferably the cathode electrode, is formed on the EIL. The at least one second electrode may be an electron-injecting electrode. The at least one second electrode may be formed of a metal, an alloy, an electrically conductive compound, or a mixture thereof. The at least one second electrode may have a low work function. For example, the at least one second electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the at least one second electrode may be formed of a transparent conductive material, such as ITO or IZO. The at least one second electrode may be a transparent or reflective electrode.

The thickness of the at least one second electrode may be in the range of about 5 nm to moo nm, for example, in the range of 10 nm to 100 nm. When the at least one second electrode is in the range of 5 nm to 50 nm, the electrode will transparent even if a metal or metal alloy is used.

The at least one second electrode is not an electron injection layer or electron transport layer.

In a preferred embodiment, the at least one second electrode is in direct contact with the electron transport region (160). Surprisingly, it was found that very good electron injection from the at least one second electrode into the electron transport region (160) can be achieved when the electron transport region (160) comprises a non-emitter dopant.

Very low operating voltages and high external quantum efficiency EQE may be achieved when the at least one second electrode is in direct contact with an electron injection layer (134). Thereby, the battery life of mobile devices is increased. However, the at least one second electrode and the electron injection layer, if present, differ in their components.

Light-Emitting Diode (OLED)

According to an aspect of the present invention, there is provided an organic light-emitting diode (OLED) comprising: a substrate, an anode electrode, a hole injection layer, a first hole transport layer, optionally a second hole transport layer, an emission layer, a first electron transport layer, optionally an electron injection interlayer, a performance enhancement layer, optionally an electron injection layer, and a cathode electrode layer, wherein the layers are arranged in that order.

According to another aspect of the present invention, there is provided an organic light-emitting diode (OLED) comprising: a substrate, an anode electrode, a hole injection layer, a first hole transport layer, optionally a second hole transport layer, an emission layer, a first electron transport layer, optionally an electron injection interlayer, a performance enhancement layer, optionally an electron injection layer, an n-type charge generation layer, an optional interlayer, a p-type charge generation layer, a third hole transport layer, optionally a fourth hole transport layer, an emission layer, a second electron transport layer, optionally an electron injection interlayer, a performance enhancement layer, optionally an electron injection layer, and a cathode electrode layer, wherein the layers are arranged in that order.

According to various embodiments of the OLED of the present invention, the OLED may not comprise an electron injection layer.

According to various embodiments of the OLED of the present invention, the OLED may not comprise an electron injection interlayer.

According to various embodiments of the OLED of the present invention, the OLED may not comprise an electron blocking layer.

According to various embodiments of the OLED of the present invention, the OLED may not comprise a hole blocking layer.

According to various embodiments of the OLED of the present invention, the OLED may not comprise a charge generation layer.

According to various embodiments of the OLED of the present invention, the OLED may not comprises a second emission layer.

Charge generation layers (CGL) that can be suitably used for the OLED of the present invention are described in US 2012/098012 A.

The charge generation layer is generally composed of a double layer. The charge generation layer can be a pn junction charge generation layer joining n-type charge generation layer and p-type charge generation layer. The pn junction charge generation layer generates charges or separates them into holes and electrons; and injects the charges into the individual light emission layer. In other words, the n-type charge generation layer provides electrons for the first light emission layer adjacent to the first electrode while the p-type charge generation layer provides holes to the second light emission layer adjacent to the at least one second electrode, by which luminous efficiency of an organic light emitting device incorporating multiple light emission layers can be further improved and at the same time, driving voltage can be lowered.

The p-type charge generation layer can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluore-7,7,8,8-tetracyanoquinodimethane (F4-TCNQ), derivative of tetracyano-quinodi-methane, radialene derivative, iodine, $FeCl_3$, $FeF_3$, and $SbC_{15}$. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The n-type charge generation layer can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

In another preferred embodiment the n-type charge generation layer is arranged adjacent to the electron transport layer.

In a further preferred embodiment the p-type charge generation layer is arranged adjacent to the hole transport layer.

In one embodiment the organic electroluminescent device of the invention can further comprise a layer comprising a radialene compound and/or a quinodimethane compound.

In one embodiment, the radialene compound and/or the quinodimethane compound may be substituted with one or more halogen atoms and/or with one or more electron withdrawing groups. Electron withdrawing groups can be selected from nitrile groups, halogenated alkyl groups, alternatively from perhalogenated alkyl groups, alternatively from perfluorinated alkyl groups. Other examples of electron withdrawing groups may be acyl, sulfonyl groups or phosphoryl groups.

Alternatively, acyl groups, sulfonyl groups and/or phosphoryl groups may comprise halogenated and/or perhalogenated hydrocarbyl. In one embodiment, the perhalogenated hydrocarbyl may be a perfluorinated hydrocarbyl. Examples of a perfluorinated hydrocarbyl can be perfluormethyl, perfluorethyl, perfluorpropyl, perfluorisopropyl, perfluorobutyl, perfluorophenyl, perfluorotolyl; examples of sulfonyl groups comprising a halogenated hydrocarbyl may be trifluoromethylsulfonyl, pentafluoroethylsulfonyl, pentafluorophenylsulfonyl, heptafluoropropylsufonyl, nonafluorobutylsulfonyl, and like.

In one embodiment, the radialene and/or the quinodimethane compound may be comprised in a hole injection layer, hole transporting and/or a hole generation layer the later one having the function of generating holes in a charge-generation layer or a p-n-junction.

In one embodiment, the radialene compound may have formula (XX) and/or the quinodimethane compound may have formula (XXIa) or (XXIb):

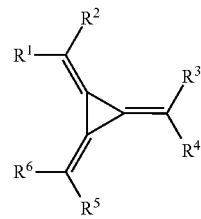

(XX)

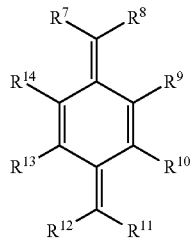

(XXIa)

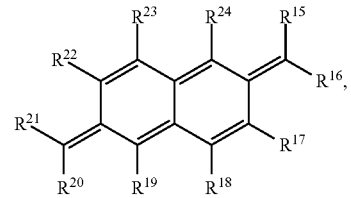

(XXIb)

wherein $R^1$, $R^2$, $R^3$, $R^4$, $R^5$, $R^6$, $R^7$, $R^8$, $R^{11}$, $R^{12}$, $R^{15}$, $R^{16}$, $R^{20}$, $R^{21}$ are independently selected from above mentioned electron withdrawing groups and $R^9$, $R^{10}$, $R^{13}$, $R^{14}$, $R^{17}$, $R^{18}$, $R^{19}$, $R^{22}$, $R^{23}$ and $R^{24}$ are independently selected from H, halogen and above mentioned electron withdrawing groups.

Method of Manufacture

According to various embodiments of the present invention, there may be provided a method for preparing an inventive organic electroluminescent device the method including forming on a substrate a first electrode the other layers of hole injection layer, a first hole transport layer, an optional second hole transport layer, an emission layer, a first electron transport layer, an optional electron injection interlayer, a performance enhancement layer, an optional electron injection layer, and a at least one second electrode layer, are deposited in that order; or the layers are deposited the other way around, starting with the at least one second electrode layer.

According to various embodiments of the present invention, the method may further include forming on a substrate a first electrode, a hole injection layer, a first hole transport layer, optionally a second hole transport layer, an emission layer, a first electron transport layer, optionally an electron injection interlayer, a performance enhancement layer, optionally an electron injection layer, an n-type charge generation layer, an optional interlayer, a p-type charge generation layer, a third hole transport layer, optionally a fourth hole transport layer, an emission layer, a second electron transport layer, optionally an electron injection interlayer, a performance enhancement layer, optionally an electron injection layer, and a at least one second electrode layer, wherein the layers are arranged in that order; or the layers are deposited the other way around, starting with the at least one second electrode layer.

The first electrode and/or the at least one second electrode can be deposited on a substrate. Preferably the first electrode is deposited on a substrate.

According to another aspect of the present invention, there is provided a method of manufacturing an organic light-emitting diode (OLED), the method using:
- at least one deposition source, preferably two deposition sources and more preferred at least three deposition sources; and/or
- deposition via vacuum thermal evaporation; and/or
- deposition via solution processing, preferably the processing is selected from spin-coating, printing, casting and/or slot-die coating.

Electronic Device

Another aspect is directed to an electronic device comprising at least one organic light-emitting diode (OLED). A device comprising organic light-emitting diodes (OLED) is for example a display or a lighting panel.

Another aspect is directed to an electronic device comprising at least one organic light-emitting transistor (OLET). A device comprising organic light-emitting transistors (OLET) is for example a display or a lighting panel.

Additional aspects and/or advantages of the invention will be set forth in part in the description which follows and, in part, will be obvious from the description, or may be learned by practice of the invention.

In one embodiment, the electronic device is an electroluminescent device. Preferably, the electroluminescent device is an organic light emitting diode.

In another embodiment the electroluminescent device is an organic light emitting transistor.

According to another aspect of the invention, it is provided an electronic device comprising at least one electroluminescent device according to any embodiment described throughout this application, preferably, the electronic device comprises the organic light emitting diode in one of embodiments described throughout this application. More preferably, the electronic device is a display device.

Details and Definitions of the Invention

The term "hydrocarbyl group" as used herein refers to any univalent radical, derived from any type of saturated, unsaturated or aromatic hydrocarbon.

The term "alkane" as used herein refers to a saturated hydrocarbon. It may be linear, branched or cyclic and the hydrogen atoms may be partially or fully substituted by other non-metal atoms for example halogen, oxygen, nitrogen, sulphur, but not restricted thereto.

The term "fluorinated" as used herein refers to a hydrocarbon group in which at least one of the hydrogen atoms comprised in the hydrocarbon group is substituted by a fluorine atom. Fluorinated groups in which all of the hydrogen atoms thereof are substituted by fluorine atoms are referred to as perfluorinated groups and are particularly addressed by the term "fluorinated".

In terms of the invention, a group is "substituted by" another group if one of the hydrogen atoms comprised in this group is replaced by another group, wherein the other group is the substituent.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the low refractive index compound (LRIC) the compounds mentioned in the experimental part are most preferred.

The inventive organic electronic device may be an organic electroluminescent device (OLED), a lighting device, or an organic field-effect transistor (OFET). A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device. Another aspect is directed to a device comprising at least one organic electroluminescent device (OLED).

A device comprising organic light-emitting diodes is for example a display or a lighting panel. In the present invention, the following defined terms, these definitions shall be applied, unless a different definition is given in the claims or elsewhere in this specification.

In the context of the present specification the term "different" or "differs" in connection with a material means that the material differs in its structural Formula.

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the n-type dopant and the matrix compound are essentially non-emissive or non-emitting.

The operating voltage, also named U, is measured in Volt (V) at 10 milliAmpere per square centimeter (mA/cm2).

The candela per Ampere efficiency, also named cd/A efficiency is measured in candela per ampere at 10 milliAmpere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "organic light emitting device", "organic optoelectronic device" and "organic light-emitting diode" are simultaneously used and have the same meaning.

The term "life-span" and "lifetime" are simultaneously used and have the same meaning. The anode electrode and cathode electrode may be described as anode electrode/cathode electrode or anode electrode/cathode electrode or anode electrode layer/cathode electrode layer.

Room temperature, also named ambient temperature, is 230 C.

DETAILED DESCRIPTION

Different low refractive index materials of different chemical nature have been tested in context with the present invention, namely ADD-1, ADD-3 and ADD-5 in OLED devices. Some low refractive index materials particularly suitable in the sense of this invention are listed in Table 1 below.

TABLE 1

| Compound Name | Structure formula |
|---|---|
| ADD-1 | 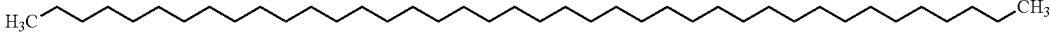<br>C40H82 |
| ADD-2 | 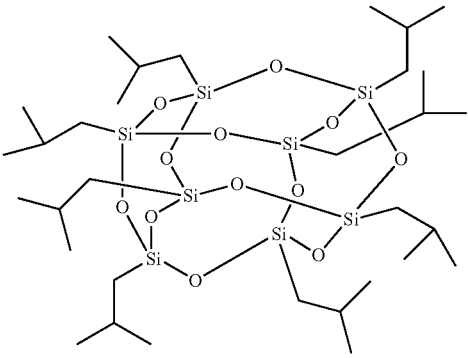<br>C32H72O12Si8 |

TABLE 1-continued
| Compound Name | Structure formula |
|---|---|
| ADD-3 | 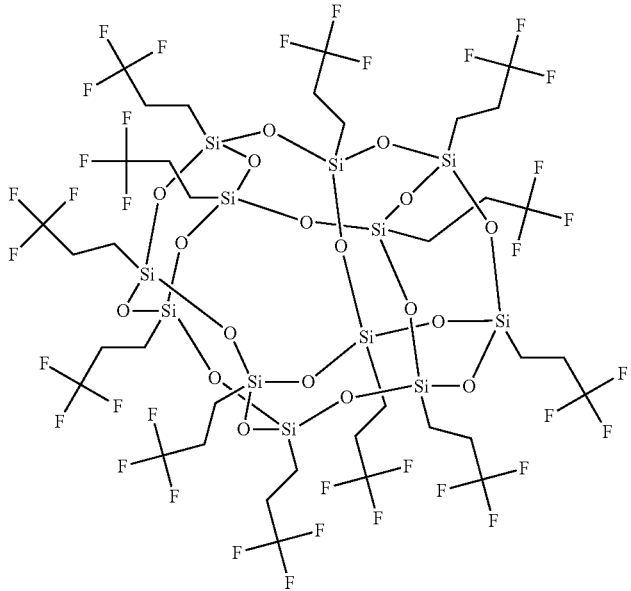<br>C36H48F36O18Si12 |
| ADD-4 | 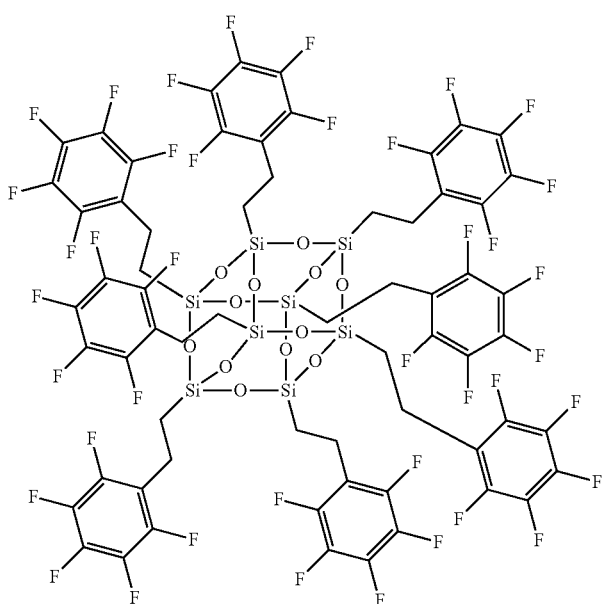<br>C64H32F40O12Si8 |
| ADD-5 | LiF |

Further compounds used in the below device examples are shown in Table 2.
TABLE 2
| Compound name | Molecular Structure | Reference |
|---|---|---|
| HTM-1 | 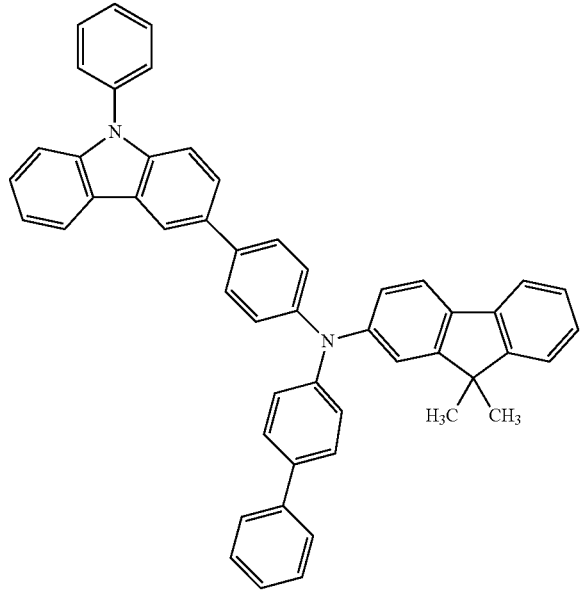 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] | US2016322581 |
| HTM-2 | 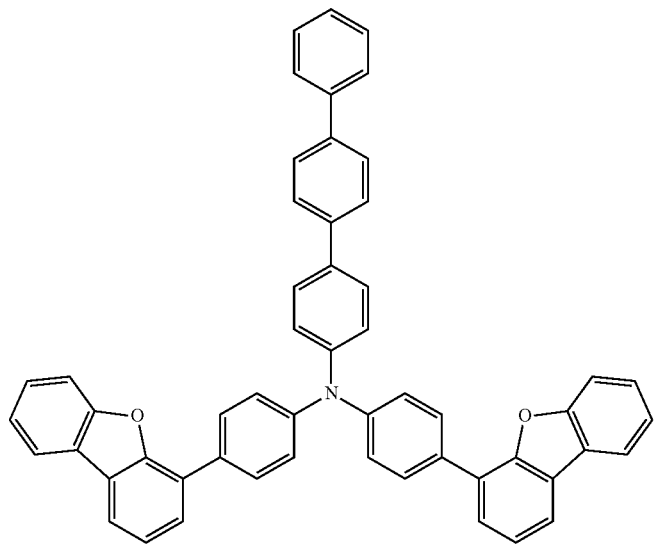 [SMILES: c1ccc(-c2ccc(-c3ccc(N(c4ccc(-c5cccc6c5oc5ccccc56)cc4)c4ccc(-c5cccc6c5oc5ccccc56)cc4)cc3)cc2)cc1] | JP2014096418 A2 |

TABLE 2-continued

| Compound name | Molecular Structure | Reference |
|---|---|---|
| PD-1 | 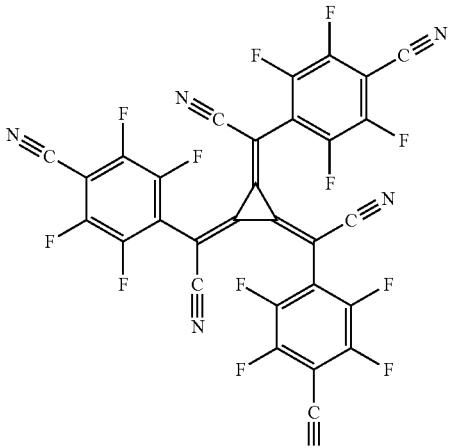 | US2008265216 |
| Host-1 | ABH112 fluorescent blue host provided by Sun Fine Chemicals, (SFC), Korea, structure not public | |
| Host-2 | ABH113 fluorescent blue host provided by Sun Fine Chemicals, (SFC), Korea, structure not public | |
| Emitter-1 | BD369 fluorescent blue emitter provided by Sun Fine Chemicals (SFC), Korea, structure not public | |
| Emitter-2 | BD200 fluorescent blue emitter provided by Sun Fine Chemicals (SFC), Korea, structure not public | |
| ETM-1 | 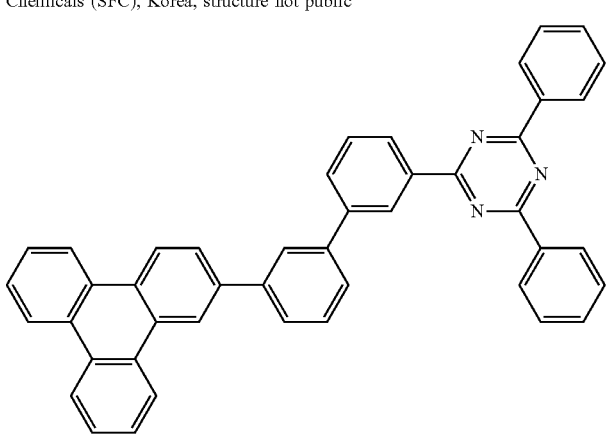 | KR2017011338 |
| ETM-2 | 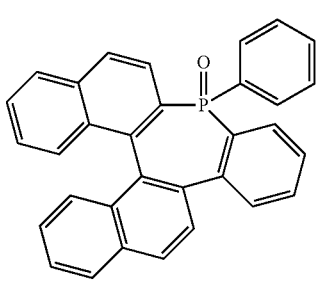 [SMILES: O=P1(c2ccccc2)c2ccccc2-c2ccc3ccccc3c2-c2c1ccc1ccccc21] | WO2015097225A1 |
| ND-1 | Ytterbium | WO2015097232A1 |

Measurement method to determine the refractive index of the performance enhancement layer.

The refractive index of the performance enhancement layers were determined by ellipsometry. The ellipsometer used was a M2000-UI as supplied by J.A. Woollam Co., Inc. (USA) operating in a wavelength range of 245-1690 nm with horizontal base and automatically controlled angle of 45°-90°. Layers of sub-nm thickness can be measured as well as films up to tens of microns thick. In order to account for anisotropy in the refractive index of the film interference enhanced silicon substrates (IES) were used having a 950 nm silicon oxide layer on the silicon surface. In detail, the measurement is described in Guskova et al. J. Phys. Chem. C 2013, 117, 17285; D and Yokoyama et al., Appl. Phys. Lett. 2008, 93, 173302.

TABLE 3

Table 3: Layer sequence in OLED device examples, materials used, layer thicknesses, concentrations.

| Layer Name | Material Names | Concentration [wt %] | Layer thickness [nm] |
|---|---|---|---|
| Anode | ITO | | 90 |
| HIL | HTM-1:PD-1 | 3 | 10 |
| HTL-1 | HTM-1 | | 110 |
| HTL-2 | HTM-2 | | 10 |
| EML | Host-1 or Host-2: Emitter-1 or Emitter-2 | 3 | 20 |
| ETL-1 | ETM-1 | | 10 |
| EIIL | ETM-2:Yb | 5 | 0 or 5 |
| Performance Enhancement Layer | ETM-2:ADD-1 to 4:ND-1 | varied | 30 |
| Cathode | Al | | 100 |

—Table 4: OLED device performance data using LRIC ADD-3 and Host-1:Emitter-1. The devices differ in the material composition of performance enhancement layer and electron injection interlayer. The comparative example has no performance enhancement layer. The best efficiency was achieved in Inv-OLED 2 by using a concentration ratio of ETM-2:Yb:ADD-3 with wt % 43:47:10 in the performance enhancement layer and a concentration ratio ETM-2:Yb of wt % 95:5 in the electron injection interlayer. Inv-OLED 4 without electron injection interlayer has also improved efficiency of about +7% at a voltage penalty of +6% on relative measures vs the comparative example.

TABLE 4

| Sample | composition performance enhancement layer [wt %] | thickness [nm] | Interlayer EIIL [wt %] | thickness [nm] | Voltage @ [10 mA/cm$^2$] | Qeff (%) @ 10 mA/cm$^2$ |
|---|---|---|---|---|---|---|
| Comparative Example (no LRIC) | ETM-2:Yb 95:5 | 30 | ETM-2:Yb 95:5 | 5 | 3.85 | 7.52 |
| Inv-OLED 1 | ETM-2:Yb:ADD-3 62:28:10 | 30 | ETM-2:Yb 95:5 | 5 | 3.86 | 8.51 |
| Inv-OLED 2 | ETM-2:Yb:ADD-3 43:47:10 | 30 | ETM-2:Yb 95:5 | 5 | 3.85 | 8.71 |
| Inv-OLED 3 | ETM-2:Yb:ADD-3 48:47:5 | 30 | ETM-2:Yb 95:5 | 5 | 3.85 | 8.59 |
| Inv-OLED 4 (no EIIL) | ETM-2:Yb:ADD-3 48:47:5 | 30 | None | 0 | 4.08 | 8.01 |

TABLE 5

Table 5: OLED device performance data using LRIC ADD-1 and with Host-1:Emitter-1 using the material composition of the performance enhancement layer ETM-2:Yb:ADD-1 with wt % 62:28:10. Layer thicknesses as in Table 4.

| Sample | composition performance enhancement layer [wt %] | Interlayer, EIIL wt % | Voltage (V), [10 mA/cm$^2$] | Qeff (%), 10 mA/cm$^2$ |
|---|---|---|---|---|
| Inv-OLED 5 | ETM-2:Yb:ADD-1 62:28:10 | ETM-2:Yb 95:5 | 3.88 | 7.76 |

TABLE 6

Table 6: OLED device performance data using LRIC ADD-5 and with Host-2:Emitter-2 using different material compositions of the performance enhancement layer. The best performance was achieved with Inv-OLED 6 using the composition of the performance enhancement layer of ETM-2:Yb:ADD-5 with wt % 42:57:1. Layer thicknesses as Table 4.

| Sample | composition performance enhancement layer [wt %] | Interlayer, EIIL wt % | Voltage (V), [10 mA/cm$^2$] | Qeff (%), 10 mA/cm$^2$ |
|---|---|---|---|---|
| Inv-OLED 6 | ETM-2:Yb:ADD-5 42:57:1 | ETM-2:Yb 95:5 | 3.82 | 10.50 |
| Inv-OLED 7 | ETM-2:Yb:ADD-5 66:33:1 | ETM-2:Yb 95:5 | 3.80 | 10.00 |

TABLE 7

Table 7: Refractive Indices of inventive performance enhancement layers (PEL) measured by ellipsometry.

| Sample Name | Performance Enhancement Layer Composition | Refractive Index n (measured at wavelength 1200 nm) | Layer Thickness |
|---|---|---|---|
| PEL-1 | ETM-2:ADD-1 (50:50 wt %) | 1.57 ± 0.02 | 100 nm layer on IES Si substrate |
| PEL-2 | ETM-2:ADD-2 (50:50 wt %) | 1.552 ± 0.002 | 100 nm layer on IES Si substrate |
| PEL-3 | ETM-2:ADD-3 (50:50 wt %) | 1.54 ± 0.01 | 100 nm layer on IES Si substrate |

The features disclosed in the foregoing description, in the claims and/or in the accompanying drawings may, both separately and in any combination thereof, be material for realizing the invention in diverse forms thereof.

The invention claimed is:

1. Organic electroluminescent device comprising a first electrode, at least one second electrode, at least one emission layer and at least one electron transport region, wherein the emission layer and the electron transport region are arranged between the at least one second electrode and the first electrode and the electron transport region is arranged between the emission layer and the at least one second electrode, wherein the at least one electron transport region comprises
   a) a first electron transport layer; and
   b) a performance enhancement layer, the performance enhancement layer having a refractive index of ≤1.6 at a wavelength of 1,200 nm;
   wherein
   the first electron transport layer is arranged between the emission layer and the performance enhancement layer; and
   the performance enhancement layer is arranged between the first electron transport layer and the at least one second electrode, and the performance enhancement layer further comprises an n-type dopant.

2. Organic electroluminescent device according to claim 1, wherein the electron transport region further comprises an electron injection interlayer, wherein the electron injection interlayer is arranged between the first electron transport layer and the performance enhancement layer.

3. Organic electroluminescent device according to claim 1, wherein the organic electroluminescent device is an organic light emitting diode or an organic electroluminescent transistor.

4. Organic electroluminescent device according to claim 1, wherein the performance enhancement layer comprises a low refractive material selected from the group consisting of silsesquioxanes, alkanes, perfluoroalkanes, perfluoroalkyl phosphonic acids, perfluorophosphine oxides, and metal fluorides.

5. Organic electroluminescent device according to claim 4, wherein the silsesquioxane is represented by the general formula $Si_xR_xO_{1.5x}$, wherein R is a hydrocarbyl group which may comprise at least one heteroatom selected from the group consisting of B, Si, N, P, O, and S, and/or which may comprise at least one substituent which is a halogen atom; and x is selected from 6, 8, 10, 12, 14, or 16.

6. Organic electroluminescent device according to claim 4, wherein the alkane is selected from alkane having 18 to 60 carbon atoms.

7. Organic electroluminescent device according to claim 4, wherein the metal fluoride is selected from LiF, NaF, KF, or mixtures thereof.

8. Organic electroluminescent device according to claim 4, wherein the low refractive material is selected from

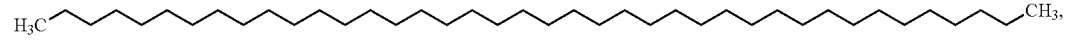

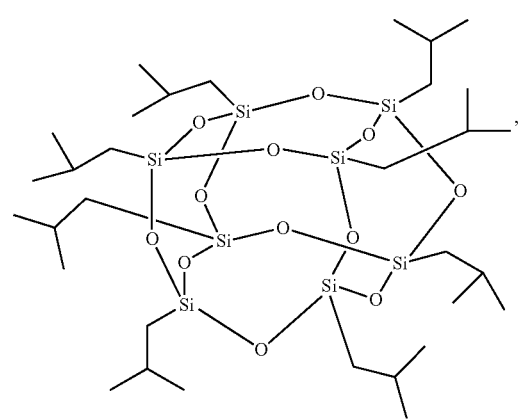

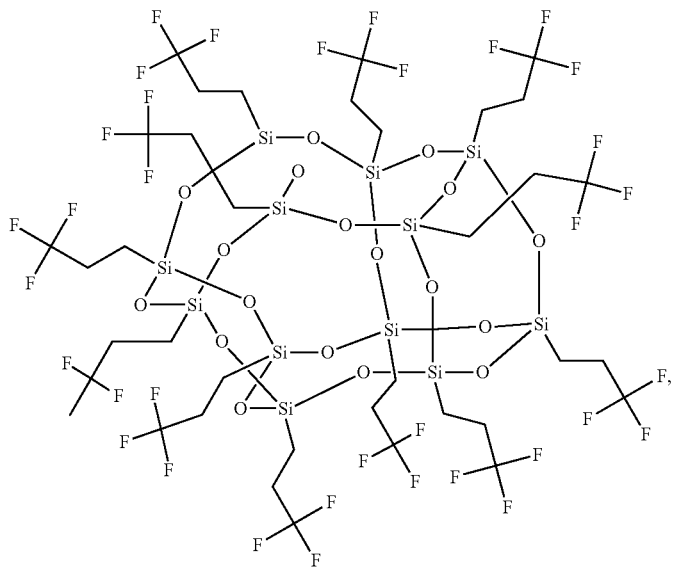

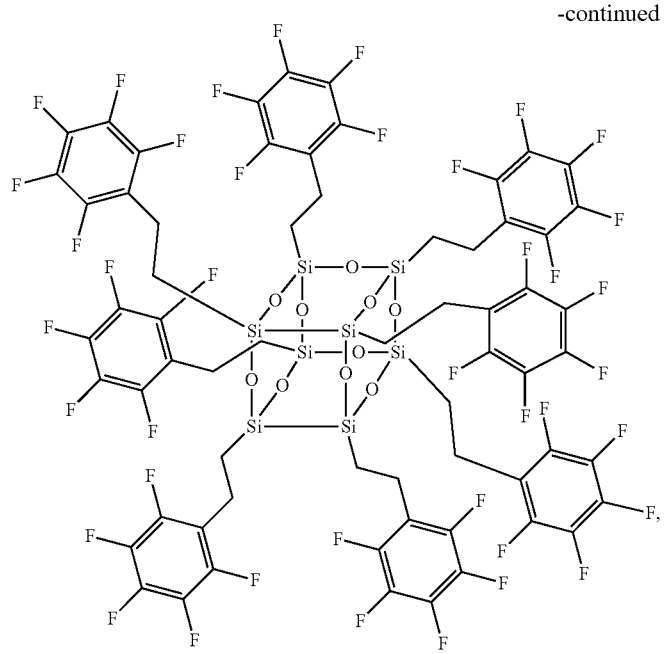

LiF, or mixtures thereof.

9. Organic electroluminescent device according to claim 1, wherein the n-type dopant is selected from alkali metal, alkaline earth metal, rare earth metal, organic complexes thereof, or halides thereof, or is a compound represented by one of the following formulae

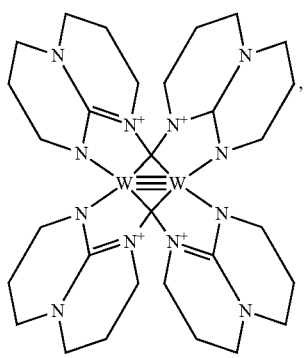

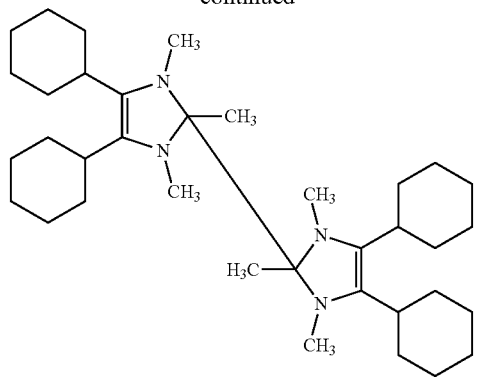

or mixtures thereof.

10. Organic electroluminescent device according to claim 1, comprising, in this order, the first electrode, a p-type doped hole transport layer, optionally a first hole transport layer, optionally a second hole transport layer, the emission layer, the first electron transport layer, optionally the electron injection interlayer, the performance enhancement layer, and the at least one second electrode.

11. Organic electroluminescent device according to claim 1, wherein the first electron transport layer does not comprise an n-type dopant.

12. Organic electroluminescent device according to claim 10, wherein the electron injection interlayer is an n-type doped electron transport layer.

* * * * *